(12) United States Patent
Straub et al.

(10) Patent No.: US 10,001,643 B2
(45) Date of Patent: Jun. 19, 2018

(54) MICROMIRROR DEVICE AND PROJECTION DEVICE

(71) Applicant: Robert Bosch GmbH, Stuttgart (DE)

(72) Inventors: Rainer Straub, Ammerbuch (DE); Johannes Baader, Freiburg (DE); Andreas Duell, Stuttgart (DE); Frederic Njikam Njimonzie, Reutlingen (DE); Joerg Muchow, Reutlingen (DE); Helmut Grutzeck, Kusterdingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days. days.

(21) Appl. No.: 15/317,214

(22) PCT Filed: May 29, 2015

(86) PCT No.: PCT/EP2015/061959
§ 371 (c)(1),
(2) Date: Dec. 8, 2016

(87) PCT Pub. No.: WO2015/189051
PCT Pub. Date: Dec. 17, 2015

(65) Prior Publication Data
US 2017/0108693 A1    Apr. 20, 2017

(30) Foreign Application Priority Data
Jun. 13, 2014   (DE) .................. 10 2014 211 379

(51) Int. Cl.
*G02B 26/08*    (2006.01)
*G03B 21/20*    (2006.01)
*B81B 3/00*    (2006.01)

(52) U.S. Cl.
CPC .......... *G02B 26/085* (2013.01); *B81B 3/0054* (2013.01); *G03B 21/2066* (2013.01); *B81B 2201/042* (2013.01); *B81B 2203/058* (2013.01)

(58) Field of Classification Search
None
See application file for complete search history.

(56) References Cited

U.S. PATENT DOCUMENTS

2004/0165243 A1* 8/2004 Helmbrecht ........... G02B 26/06
                                                     359/224.1
2012/0127551 A1* 5/2012 Eto ...................... G02B 7/1827
                                                     359/200.7
(Continued)

FOREIGN PATENT DOCUMENTS

DE   10 2012 206 269 A1   10/2013
DE   10 2012 206 291 A1   10/2013
EP        1 180 848 A1    2/2002

OTHER PUBLICATIONS

Milanovic, et al., "Laterally actuated torsional micromirrors for large Static Deflection," IEEE Photonics Technology Letters, IEEE Service Center, vol. 15, No. 2 (2003), pp. 245-247.
(Continued)

*Primary Examiner* — Jennifer D. Carruth
(74) *Attorney, Agent, or Firm* — Norton Rose Fulbright US LLP; Gerard Messina

(57) ABSTRACT

A micromirror device including a drive unit, which includes a movable drive element, which is situated in a first plane, and a guiding device, and a mirror, which is elastically coupled to the drive element and is situated in the idle position in a second plane, which is in parallel to the first plane, the guiding device being designed to guide a movement of the drive element on a straight line situated in the first plane. Furthermore, a corresponding projection device is described.

13 Claims, 8 Drawing Sheets

(56) References Cited

U.S. PATENT DOCUMENTS

| | | | |
|---|---|---|---|
| 2012/0218612 A1* | 8/2012 | Chang | H01L 41/0933 |
| | | | 359/199.4 |
| 2014/0146435 A1 | 5/2014 | Stephanou et al. | |
| 2014/0300942 A1* | 10/2014 | Van Lierop | G02B 26/0841 |
| | | | 359/199.2 |

OTHER PUBLICATIONS

International Search Report issued in PCT/EP2015/061959 dated Aug. 6, 2015.

* cited by examiner

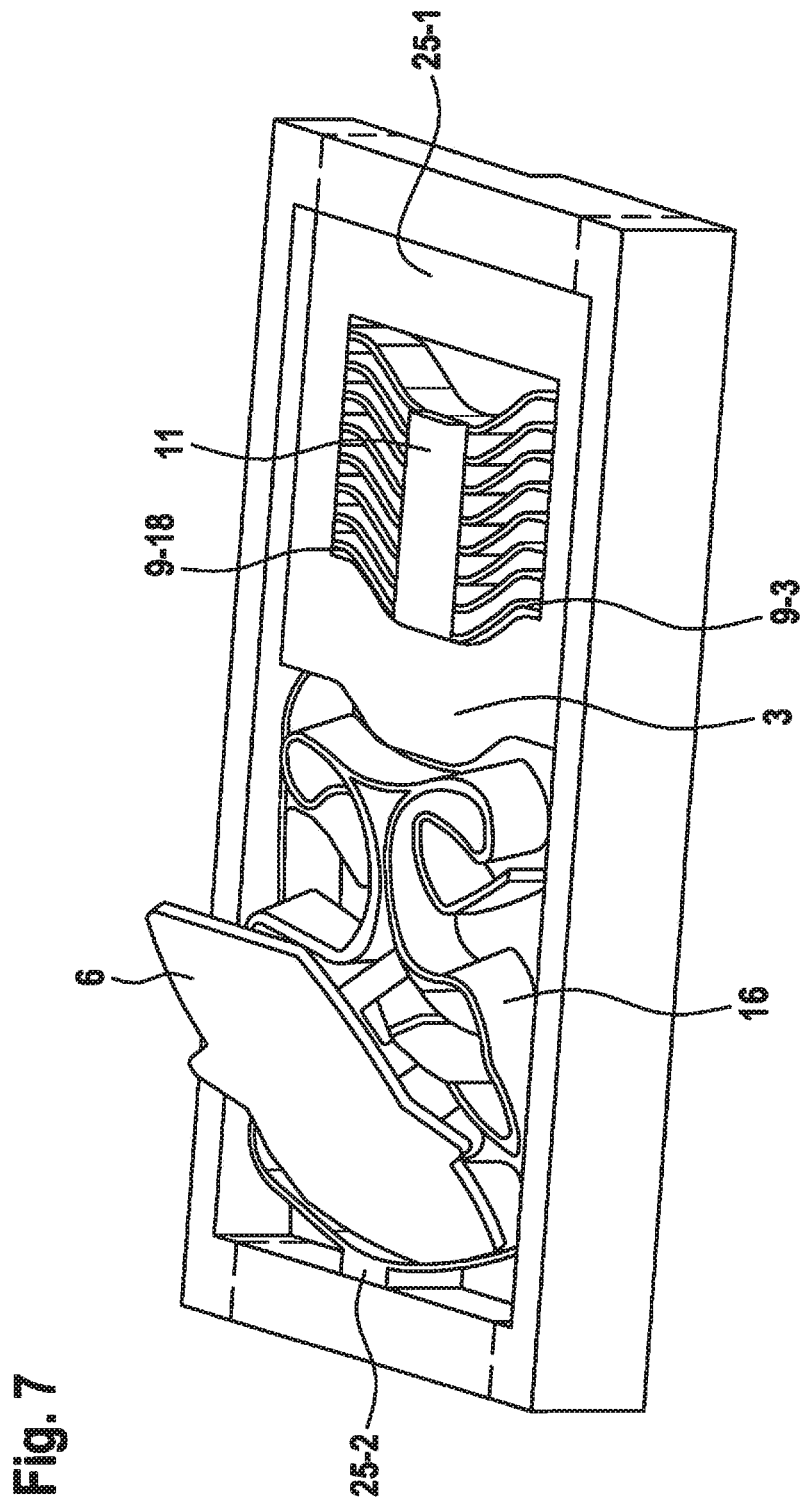

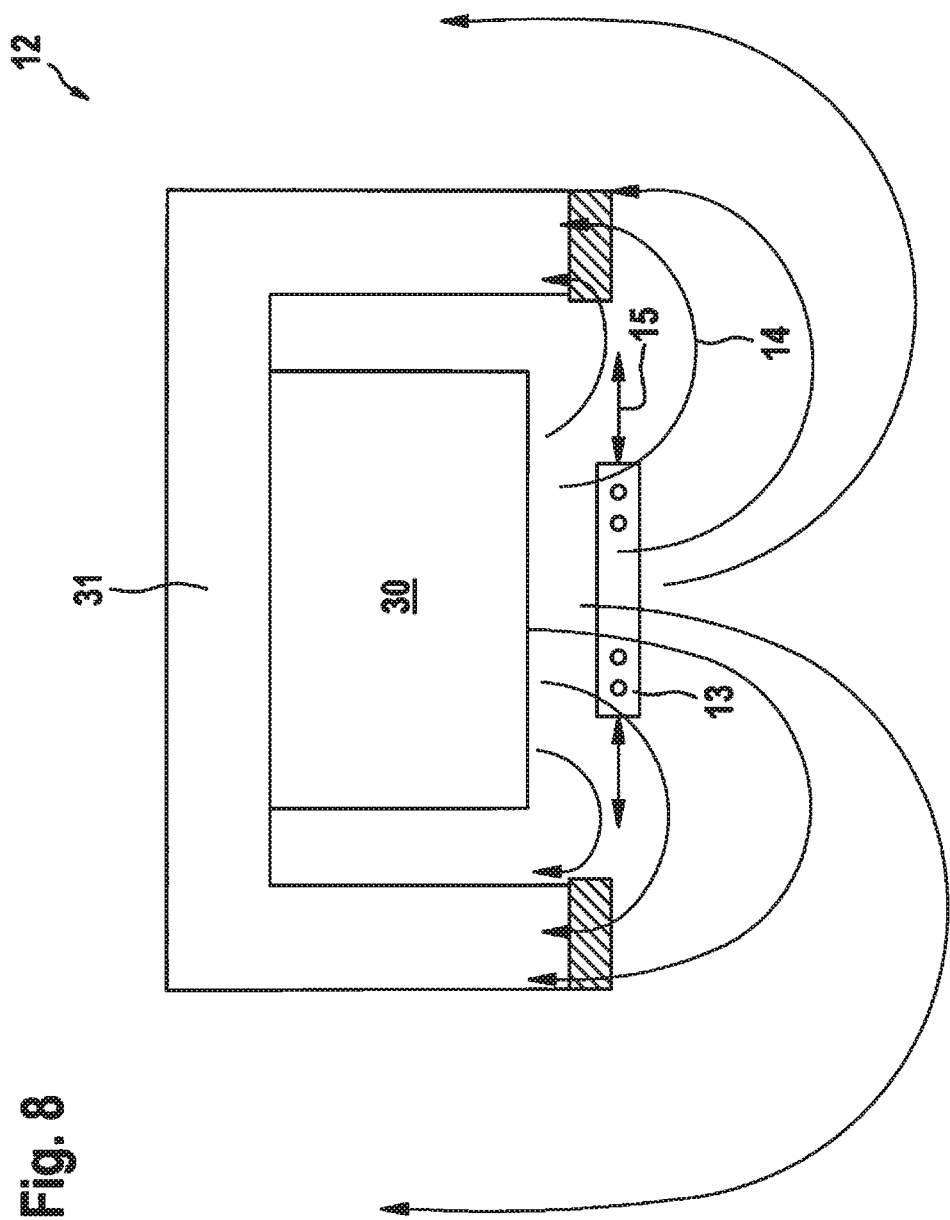

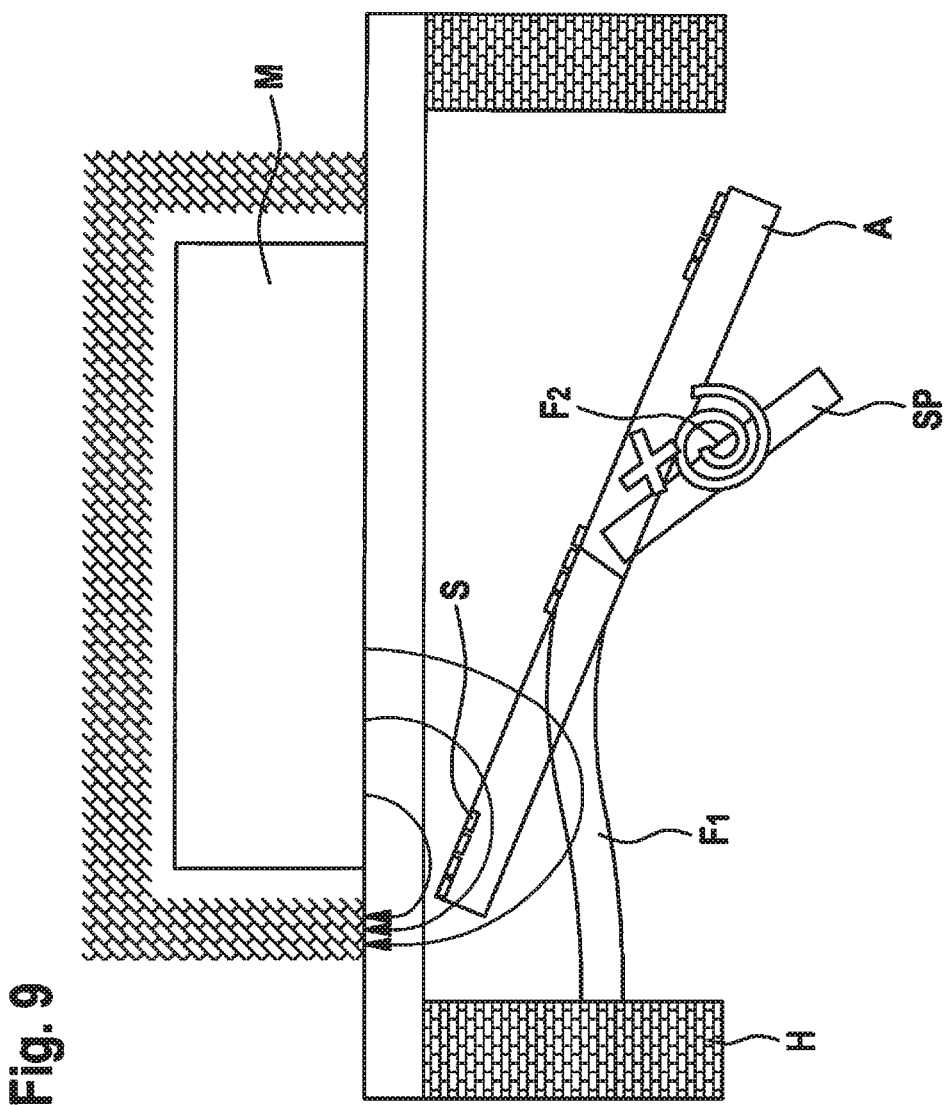

MICROMIRROR DEVICE AND PROJECTION DEVICE

FIELD

The present invention relates to a micromirror device and a projection device including a micromirror device according to the present invention.

BACKGROUND INFORMATION

Micromirrors are presently used in a continuously increasing number of applications. These applications include, for example, projectors, scanners, or the like. The advantage of the micromirrors is that they occupy little space and may therefore be used very flexibly.

Micromirrors are typically micro-electromechanical elements which are structured and manufactured, for example, with the aid of the conventional methods from semiconductor processing.

Different methods may be used to implement the deflection of the mirrors in such a micromirror. For example, electrostatic drive methods, magnetic drive methods, piezoelectric drive methods, or the like may be used. Some drive methods only offer the option of tilting the mirror in one direction. Other drive methods also offer the option of tilting the mirror in two directions. The mirror thus carries out a rotational movement about the tilt axis or tilt axes.

Due to the relatively large rotational mass of the drive of such a micromirror, the overall structure, or parts thereof, made up of a quasistatic mirror, a resonant mirror, mechanical fixing elements, magnets, electronic parts, including connecting surfaces, in particular adhesive surfaces, may be excited into undesirable oscillations.

Connecting parts made of plastic, in particular adhesive bonds, may have a significant plastic deformation in the event of such oscillations, which becomes noticeable in an undesirable energy dissipation. Mass movements in the z direction, i.e., perpendicular to the chip surface or mirror surface, are particularly critical with respect to the energy decoupling.

Such a mass movement in the z direction is part of the normal operation of such a micromirror, however, because of the basic drive arrangement in conventional micromirrors. FIG. 9 shows the schematic structure of such a micromirror, which is described, for example, in German Patent Application No. DE 10 2012 206 291.

The micromirror of FIG. 9 has a drive spring F1, via which a drive body A is connected to holder H. Mirror SP is coupled to drive body A via a second spring F2. Furthermore, a coil S, which is permeated by a magnetic field generated by magnet M, is situated on the edge of drive body A. Depending on the orientation of the magnetic field, the drive body is moved upward or downward, i.e., in the z direction, at the edge which has the coil. If the drive body is set cyclically into such a rotational movement, the mirror is also set into a rotational movement. As is apparent in FIG. 9, the movement of drive body A in the z direction is an elementary part of the drive of FIG. 9 and cannot be avoided in the drive shown.

SUMMARY

The present invention provides a micromirror device and a projection device.

The following is accordingly provided:

A micromirror device including a drive unit, which includes a movable drive element, which is situated in a first plane, and a guiding device, and including a mirror, which is elastically coupled to the drive element and is situated in a second plane in an idle position, which is in parallel to the first plane, the guiding device being designed to guide the movement of the drive element on a straight line situated in the first plane.

Furthermore, the following is provided:

A projection device including at least one light source, at least one micromirror device as recited in one of the preceding claims, and a control unit, which is designed to control the at least one micromirror device.

A movement of the drive body in the z direction, as it occurs in conventional micromirrors, results in amplified oscillations and therefore also amplified deformations in a carrier structure of the micromirror.

In accordance with the present invention, this is taken into consideration and an option is provided for setting the mirror of the micromirror device into a rotational movement and/or oscillation, and to move the drive element of the micromirror device only in a plane which is parallel to the plane in which the mirror is situated in an idle position. The movement in a plane also includes slight movements in other directions, which may occur, for example, as a result of component tolerances or deformations of components.

To be able to move the drive element only in the pre-defined direction, the present invention provides a guiding device which restricts the movement of the drive element. The guiding device is designed in such a way that the drive element is guided along a straight line, which is situated in the first plane, in parallel to the second plane, in which the mirror is situated.

With the aid of the guiding device it is therefore possible to restrict the movement of the drive element out of the provided plane. The oscillations which are induced in the entire micromirror device or in carrier elements of the micromirror device may thus be reduced to a minimum.

Advantageous specific embodiments and refinements are described herein with reference to the figures.

In one specific embodiment, the guiding device includes at least one first spring, in particular a leaf spring, which has the lowest spring stiffness in the direction of the straight line and to which at least one drive element is coupled. Since the straight line specifies the desired movement direction, the spring may be designed in such a way that a movement in the desired direction may be excited easily, movements in other directions being made difficult. The spring may have a spring stiffness in all other movement directions, for example, which is orders of magnitude greater than the spring stiffness in the desired direction.

In one specific embodiment, the at least one first spring is coupled to a carrier structure of the micromirror device at the end of the spring which is not coupled to the drive element. This enables it to induce a relative movement of the drive element in relation to the carrier structure with the aid of the spring.

In one specific embodiment, a plurality of first springs is provided, which are coupled in a symmetrically distributed way to a post standing upright on the first plane, the post being coupled to the carrier structure of the micromirror device. The stiffness of the overall system in all directions except for the desired direction, in which the springs have the lowest spring stiffness, is thus increased or multiplied as a function of the number of the springs.

In one specific embodiment, the micromirror device includes a magnet device, the drive element including an electrical coil, and the magnet device being designed to generate a magnetic field, which exerts a force on the coil in such a way that the drive element is moved on the straight line. This enables a movement of the drive element to be caused without a direct physical contact of the drive element with the magnet.

In one specific embodiment, the magnet device is situated on the carrier structure in such a way that in an idle position of the drive unit, the coil is permeated perpendicularly by the magnetic field. The maximum possible force is thus exerted in the desired direction on the drive unit.

In one specific embodiment, the drive element has at least one second spring, which is designed to couple the mirror to the drive element in such a way that the mirror is set into a cyclic rotational movement in the event of an oscillating movement of the drive element on the straight line. It is thus possible to induce a rotational movement of the mirror based on a linear oscillating movement of the drive element.

In one specific embodiment, the at least one second spring has a meandering structure, in particular having a high aspect ratio, which is designed in such a way that the at least one second spring is tiltable at least partially out of the first plane. Due to the meandering structure of the spring, the mechanical tensions nonetheless remain low in the case of high spring stiffness and small overall size.

In one specific embodiment, the guiding device is designed to provide a rotational movement of the drive element out of the first plane in a predefined tolerance range. If a rotational movement of the drive element which is only predefined in a narrow framework is enabled, the conversion of the linear movement of the drive element into a rotational movement of the mirror is improved.

In one specific embodiment, the drive unit is designed to drive the mirror in such a way that it executes a cyclic movement at a frequency of greater than 10 kHz, in particular 18 kHz to 22 kHz.

The above embodiments and refinements may be combined with one another arbitrarily whenever reasonable. Further possible embodiments, refinements, and implementations of the present invention also include combinations, which are not mentioned explicitly, of features of the present invention described above or hereafter with respect to the exemplary embodiments. In particular, those skilled in the art will also add individual aspects as improvements or supplementations to the particular basic form of the present invention.

BRIEF DESCRIPTION OF EXAMPLE EMBODIMENTS

The present invention is explained in greater detail hereafter on the basis of the exemplary embodiments indicated in the schematic figures.

FIG. 7 shows a schematic view of one specific embodiment of a micromirror device according to the present invention.

FIG. 8 shows a schematic view of one specific embodiment of a magnet device according to the present invention.

FIG. 9 shows a view of a conventional micromirror.

In all figures, identical or functionally identical elements and devices—if not otherwise indicated—have been provided with the same reference numerals.

DETAILED DESCRIPTION OF EXAMPLE EMBODIMENTS

Figure 1:
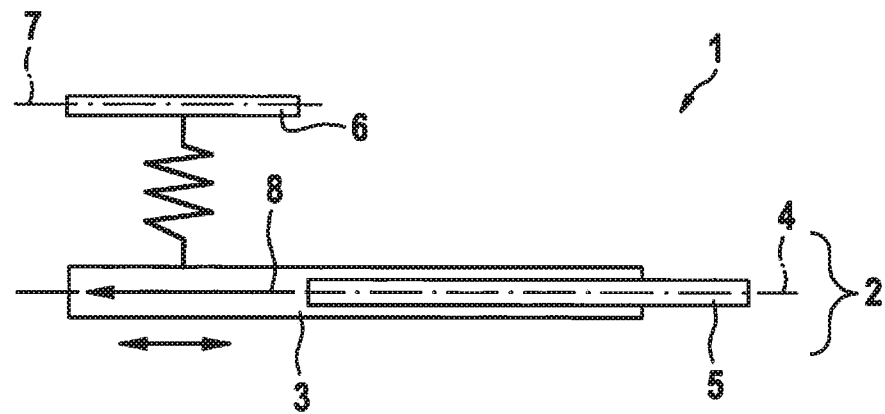
FIG. 1 shows a block diagram of one specific embodiment of a micromirror device according to the present invention.

FIG. 1 shows a block diagram of one specific embodiment of a micromirror device 1 according to the present invention.

Micromirror device 1 of FIG. 1 has a drive unit 2. Furthermore, a mirror 6 is elastically coupled to drive unit 2.

Drive unit 2 is situated in a first plane 4 and mirror 6 is situated in a second plane 7, which is situated in parallel to first plane 4 in the specific embodiment of FIG. 1.

Drive unit 2 has a drive element 3, to which mirror 6 is coupled. Furthermore, drive unit 2 has a guiding device 5, which guides a movement of drive element 3 on a straight line 8 situated in first plane 4. In one specific embodiment, guiding device 5 may be designed, for example, as a rail-type element 5, which guides the movement in the direction of straight line 8.

In one specific embodiment, guiding device 5 may have, for example, a first spring or a plurality of first springs 9-1-9-$n$. First springs 9-1-9-$n$ may have the lowest spring stiffness in the direction of straight line 8 and may be coupled to the at least one drive element 3. First springs 9-1-9-$n$ thus facilitate a movement in the direction of straight line 8 and make a movement of drive element 3 difficult in all other directions. To control the movement of drive element 3, first springs 9-1-9-$n$ may also be coupled to a carrier structure 10 of micromirror device 1, 1-1-1-$n$, in addition to drive element 3.

Drive element 3 may be designed in particular to execute a cyclic or oscillating movement in first plane 4. This enables it to carry out a resonant excitation of the system made up of drive element 3 and mirror 6, whereby it is possible to generate a defined movement of mirror 6 at a predefined frequency.

The movement of mirror 6 itself is dependent on the type of the elastic coupling between mirror 6 and drive element 3. In one specific embodiment, the elastic coupling may be designed, for example, in such a way that mirror 6 carries out a rotational movement about an axis, which is situated approximately in the middle between mirror 6 and drive element 3, when drive element 3 is moved back and forth on straight line 8.

Figure 2:
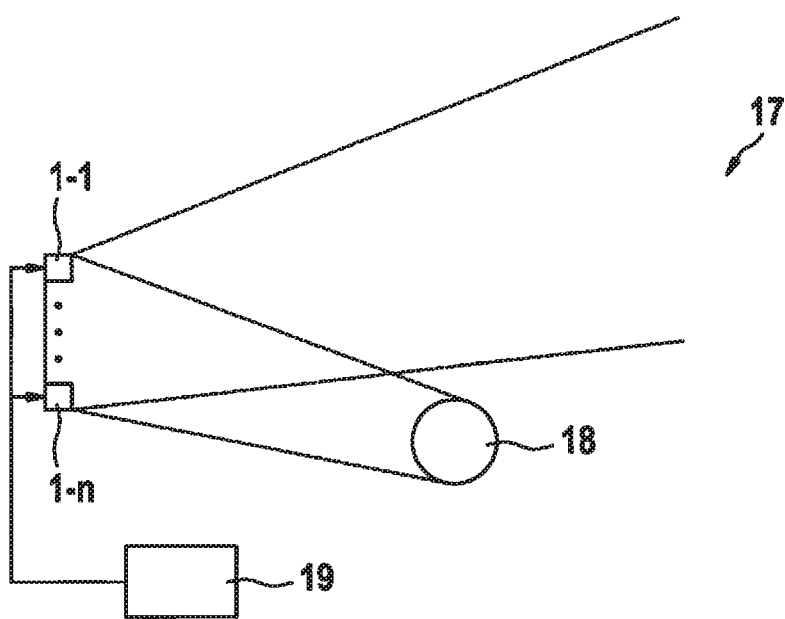
FIG. 2 shows a block diagram of one specific embodiment of a projection device according to the present invention.

FIG. 2 shows a block diagram of one specific embodiment of a projection device 17 according to the present invention.

Projection device 17 may be, for example, a video projector for the projection of films or images on a screen. However, projection device 17 may also be a projection device 17 which is used, for example, in an HUD display in a vehicle. Further embodiments are also possible.

Projection device 17 includes a light source 18, which may be, for example, a conventional lamp, an LED lamp, a laser light source, or the like. Light source 15 is situated in such a way that it illuminates a plurality of micromirrors 1-1-1-*n* (shown by dashed lines in FIG. 2). Individual micromirror devices 1-1-1-*n* of the array reflect the light in the direction, for example, of a screen or the like (not shown separately in FIG. 2).

Projection device 17 furthermore includes a control unit 19, which controls micromirror devices 1-1-1-*n*. For this purpose, control unit 19, depending on the specific embodiment, may provide one or multiple control voltages, for example, which control the alignment of individual micromirror devices 1-1-1-*n*. Control unit 19 may also be designed in one specific embodiment to control light source 18. Furthermore, control unit 19 may also include an interface, via which control unit 19 may receive image data, for example. This interface may be, for example, an HDMI interface, a DVI interface, or the like. This interface may also be a network interface or the like, however.

Figure 3:
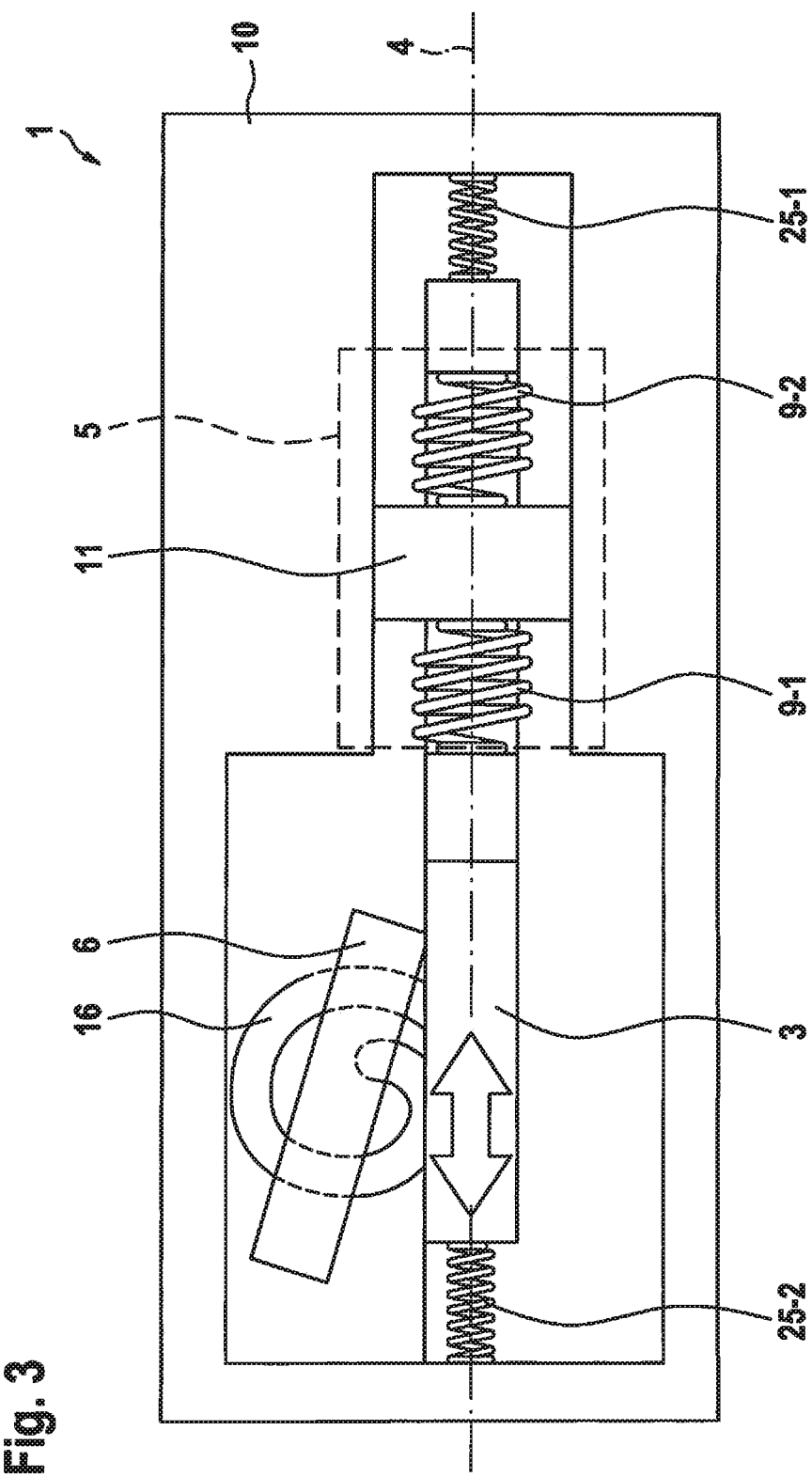
FIG. 3 shows a schematic view of one specific embodiment of a micromirror device according to the present invention.

FIG. 3 shows a schematic view of one specific embodiment of a micromirror device 1 according to the present invention in a side view.

Micromirror device 1 of FIG. 3 includes a carrier structure 10, which encloses mirror 6 and drive unit 2 and has in its center a cavity for mirror 6 and drive unit 2. The cavity is approximately split into two, the left half having mirror 6 and a part of drive element 3 and the right half having the second part of drive element 3 and guiding device 5. A post 11, which is part of the carrier structure and extends from top to bottom through the cavity, is situated approximately in the center of the right half of the cavity. Guiding device 5 has first springs 9-1 and 9-2, which are fastened on the right and left to the post and are coupled at their other end to drive element 3.

FIG. 3 furthermore shows a second spring 16 in the form of a worm, which couples mirror 6 to drive element 3. The worm shape of second spring 16 is to indicate that the linear movement of drive element 3 is converted into a rotational movement of mirror 6.

Finally, micromirror device 1 of FIG. 3 has two spring elements 25-1, 25-2, which couple the drive element at each of the lateral ends to carrier structure 10.

In the specific embodiment shown in FIG. 3, drive element 3 is not fixedly coupled to carrier structure 10 at any point. Rather, drive element 3 is spring mounted. First springs 9-1 and 9-2 may be designed, for example, in such a way that drive element 3 does not only carry out a solely translational movement from left to right and back. Rather, first springs 9-1 and 9-2 may be designed in such a way that a minimal rotational movement, which is in a predefined tolerance range, of drive element 3 is made possible. This may assist the conversion of the linear movement of drive element 3 into a rotational movement of mirror 6.

Figure 4:
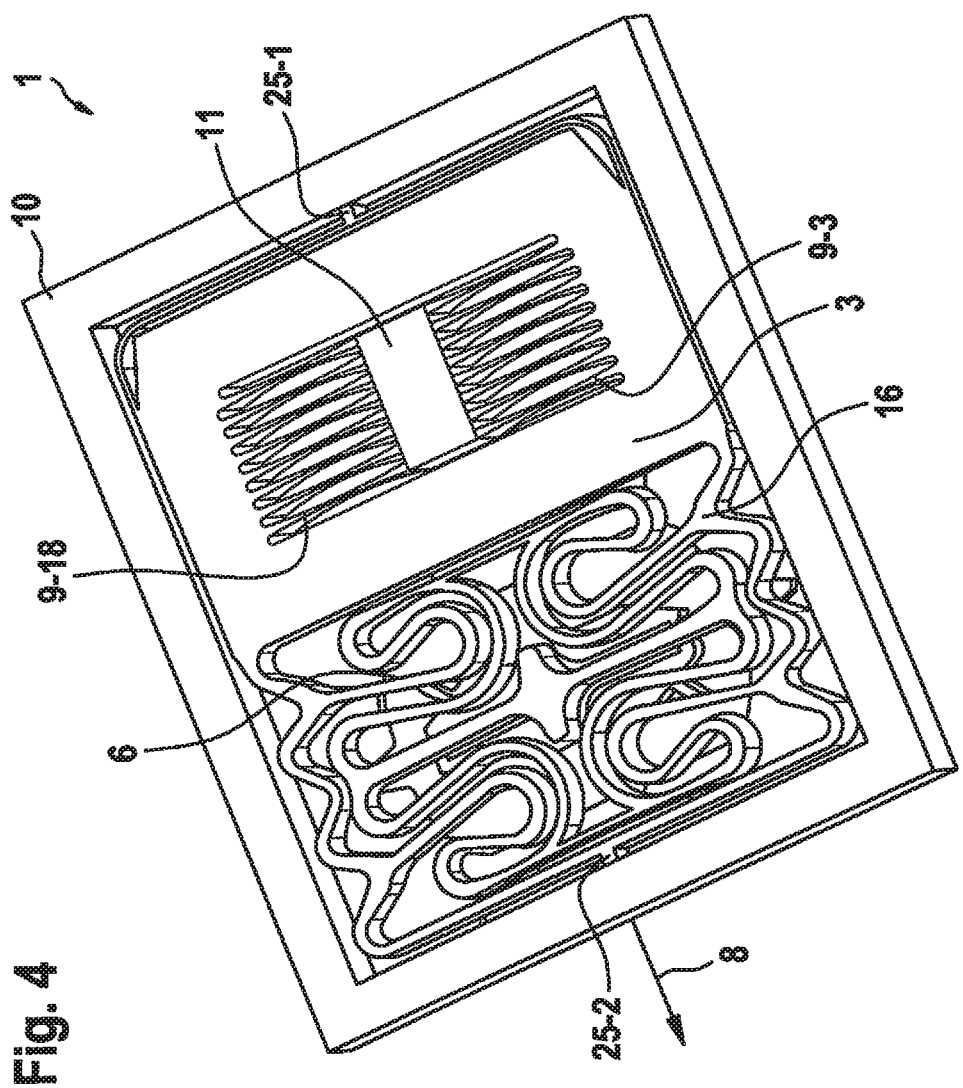
FIG. 4 shows a schematic view of one specific embodiment of a micromirror device according to the present invention.

FIG. 4 shows a schematic view of one specific embodiment of a micromirror device 1 according to the present invention in a perspective top view. Mirror 6 is situated, in the view of FIG. 4, under drive unit 2 and the upper and lower parts of carrier structure 10 are not shown. Therefore, only a frame around drive unit 3 and mirror 6 are visible of carrier structure 10.

Micromirror device 1 of FIG. 4 is based on micromirror device 1 of FIG. 3 and differs therefrom in that guiding device 5 has a plurality of first springs 9-3-9-18, which are designed as leaf springs, and of which eight springs each extend perpendicularly to straight line 8 situated in first plane 4 on two sides of post 11 from post 11 to drive element 3. Post 11 is in turn fixedly connected to the housing, so that there is a direct mechanical contact to frame 10. The leaf of leaf springs 9-3-9-18 is situated vertically from top to bottom in each case. Therefore, leaf springs 9-3-9-18 have a lower spring stiffness in the direction of straight line 8 than from top to bottom.

Second spring 16 is designed in FIG. 4 as a meandering structure 4, which is situated in first plane 4 in the idle position. Meandering structure 4 enables a rotational movement of mirror 6 in the case of an approximately linear lateral movement of drive element 3.

Spring elements 25-1, 25-2 are designed as bars in FIG. 4, which extend over the entire inner width of carrier structure 10 and are coupled in their middle to carrier structure 10.

Figure 5:
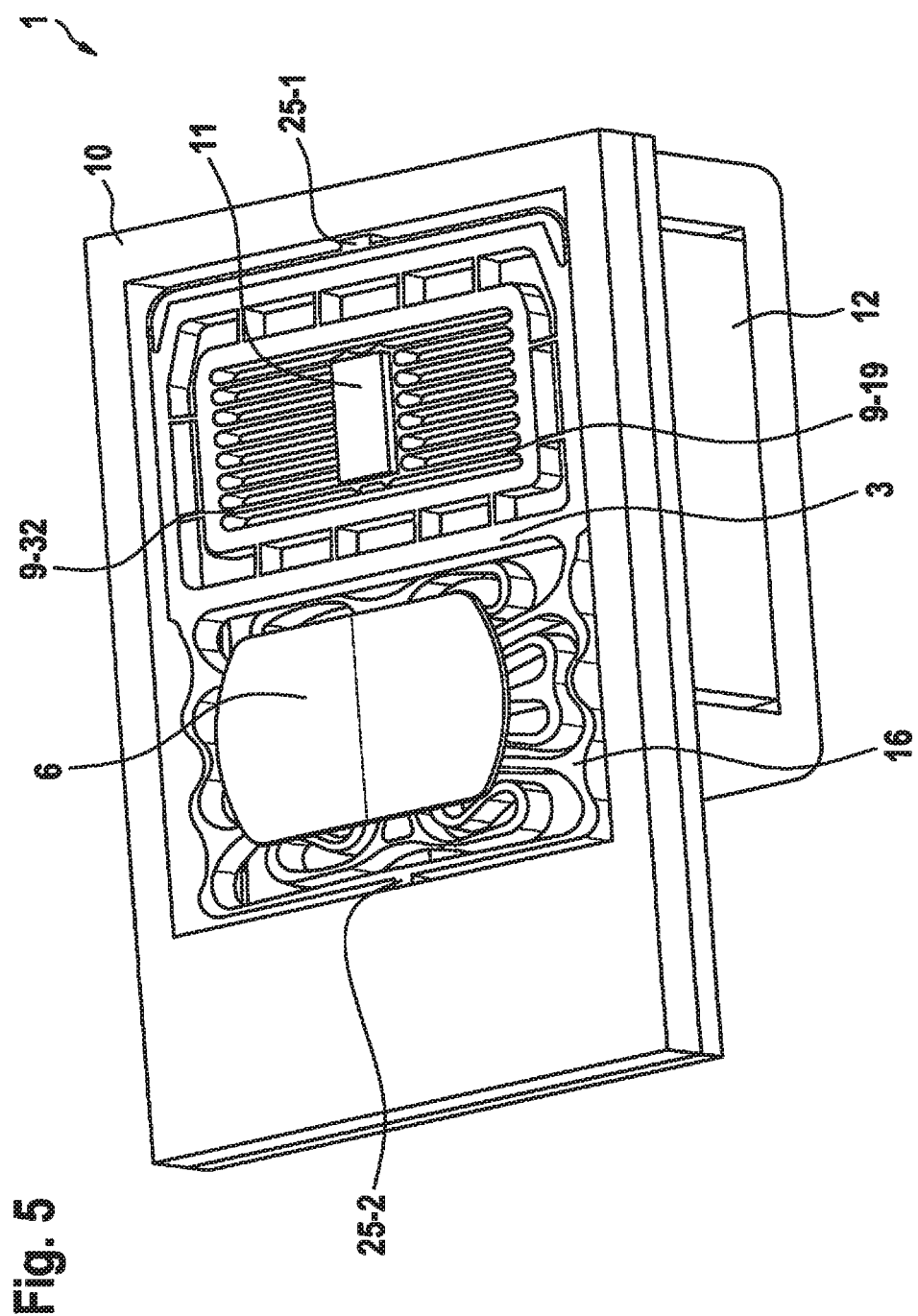
FIG. 5 shows a schematic view of one specific embodiment of a micromirror device according to the present invention.

FIG. 5 shows a schematic view of one specific embodiment of a micromirror device 1 according to the present invention in a perspective view. In the view of FIG. 5, mirror 6 is situated above drive unit 2 and the upper and lower parts of carrier structure 10 are not shown.

The micromirror device of FIG. 5 has a magnet device 12, which is designed to generate a magnetic field 14, so that drive unit 3 is set into an oscillation when an alternating current is applied to coil 13, which is situated on the drive body. This will be explained in detail in conjunction with FIG. 8. Magnet device 12 is situated in the view of FIG. 5 on the side of drive unit 3 facing away from mirror 6.

Figure 6:
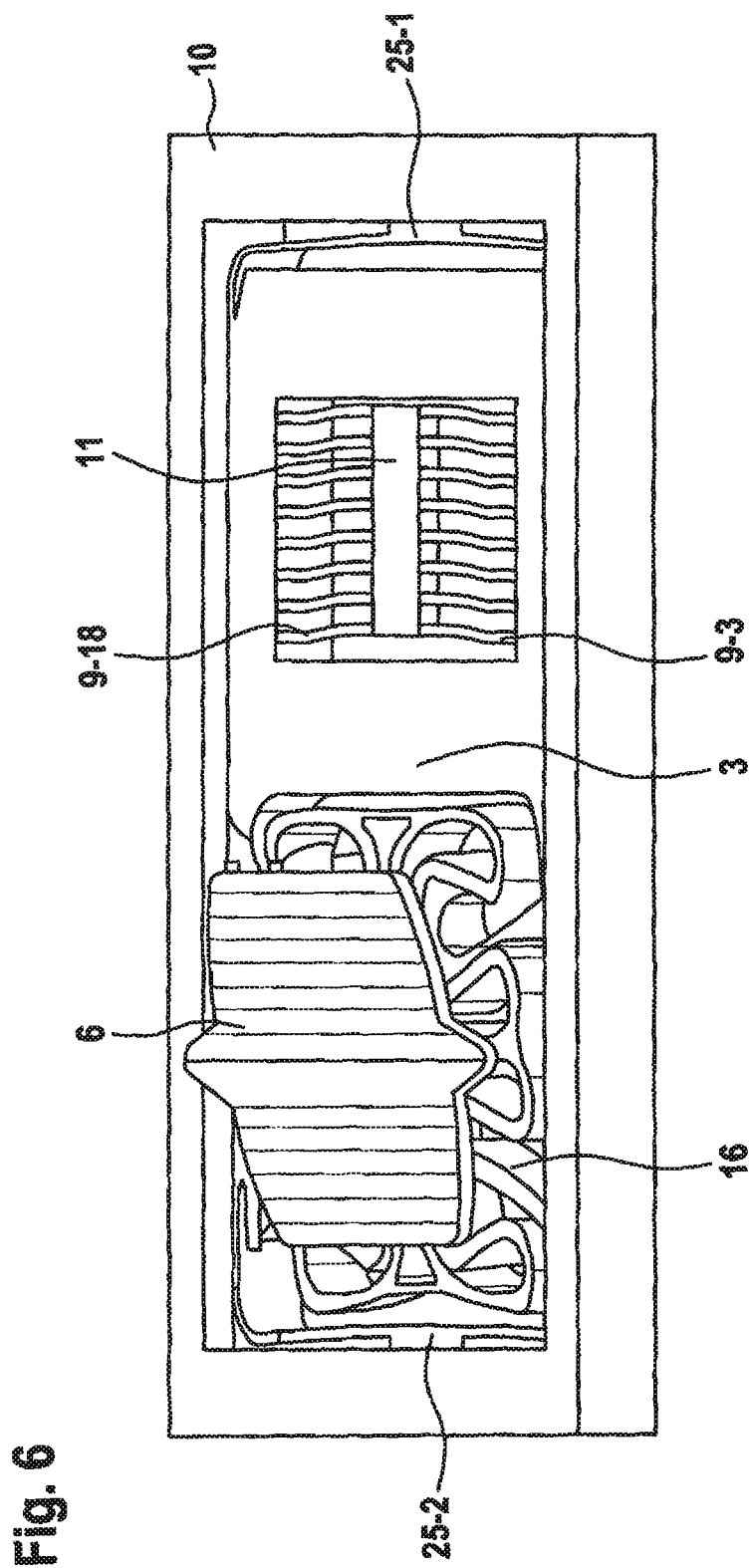
FIG. 6 shows a schematic view of one specific embodiment of a micromirror device according to the present invention.

FIG. 6 shows a schematic view of one specific embodiment of a micromirror device 1 according to the present invention in a perspective view. In the view of FIG. 6, mirror 6 is also situated above drive unit 3 and the upper and lower parts of carrier structure 10 are not shown. Micromirror device 1 of FIG. 6 is based on the micromirror device of FIG. 4, in which guiding device 5 has eight leaf springs 9-3-9-18 on each side of post 11.

Micromirror device 1 of FIG. 6 is shown in a phase of the movement of mirror 6 in which mirror 6 is tilted slightly to the left. This position of mirror 6 is induced during a movement of drive element 3 from left to right.

It is apparent in FIG. 6 that leaf springs 9-3-9-18 originating from the post are bent to the left. Entire drive element 3 is thus displaced to the left from the idle position and is on the way back into the idle position.

FIG. 7 shows a schematic view of one specific embodiment of a micromirror device 1 according to the invention according to FIG. 6.

FIG. 7 shows a phase of the movement of mirror 6 in which mirror 6 is rotated maximally to the left. At the same time, first springs 9-3-9-18 are deflected maximally to the right. FIG. 7 shows the position of individual first springs 9-3-9-18 in a maximum deflection.

The movement is continued by a directional reversal, during which first springs 9-3-9-18 are relaxed and therefore move drive element 3 back to the left again. The mirror is thus raised again from the maximally tilted position.

FIGS. 6 and 7 make it clear how a rotational movement of mirror 6 may be induced by a lateral linear deflection of drive element 3.

FIG. 8 shows a schematic view of one specific embodiment of a magnet device 12 according to the present invention.

Magnet device 12 includes a U-shaped housing 31 situated around a magnet 30, for example, a hard magnet 30. The lines of magnetic field 14 emerge from magnet 30 in such a way that they exit perpendicularly below magnet 30. A coil 13 is situated below magnet 30, which is situated on drive element 3 in one specific embodiment. If coil 13 is permeated perpendicularly by the magnetic field lines of magnetic field 14, a force results on coil 13 and therefore, for example, on drive element 3, in the lateral direction. Coil 13 and therefore drive element 13 may be set into an oscillation with the predefined frequency by an activation of magnet 13 using an AC voltage of a predefined frequency.

Although the present invention was described above on the basis of preferred exemplary embodiments, it is not restricted thereto, but rather is modifiable in a variety of ways. In particular, the present invention may be changed or modified in manifold ways without departing from the core of the present invention.

What is claimed is:

1. A micromirror device, comprising:
   a drive unit situated in a first plane, the drive unit including a movable drive element and a guiding device; and
   a mirror elastically coupled to the drive element, the mirror being situated in an idle position in a second plane, which is in parallel to the first plane;
   wherein the guiding device is designed to guide a movement of the drive element on a straight line situated in the first plane such that the movement of the drive element is at least substantially entirely on the straight line.

2. The micromirror device as recited in claim 1, further comprising:
   a magnet device;
   wherein the drive element includes an electrical coil, and the magnet device is designed to generate a magnetic field which exerts a force on the electrical coil in such a way that the drive element is moved on the straight line.

3. The micromirror device as recited in claim 2, wherein the magnet device is situated on the carrier structure in such a way that the electrical coil is permeated perpendicularly by the magnetic field in an idle position of the drive unit.

4. The micromirror device as recited in claim 1, wherein the drive element includes at least one second spring which is designed to couple the mirror to the drive element in such a way that the mirror is set into a cyclic rotational movement in the event of an oscillation movement of the drive element on the straight line.

5. The micromirror device as recited in claim 4, wherein the at least one second spring has a meandering structure, which is designed in such a way that the at least one second spring is tiltable at least partially out of the first plane.

6. The micromirror device as recited in claim 1, wherein the guiding device is designed to provide a rotational movement of the drive element out of the first plane in a predefined tolerance range.

7. The micromirror device as recited in claim 1, wherein the drive unit is designed to drive the mirror in such a way that it executes a cyclic movement at a frequency of greater than 10 kHz.

8. The micromirror device as recited in claim 1, wherein the drive unit is designed to drive the mirror in such a way that it executes a cyclic movement at a frequency of 18 kHz to 30 kHz.

9. A micromirror device, comprising:
   a drive unit situated in a first plane, the drive unit including a movable drive element and a guiding device; and
   a mirror elastically coupled to the drive element, the mirror being situated in an idle position in a second plane, which is in parallel to the first plane;
   wherein the guiding device is designed to guide a movement of the drive element on a straight line situated in the first plane,
   wherein the guiding device includes at least one first spring, the at least one first spring including a leaf spring which has a lowest spring stiffness in a direction of the straight line and is coupled to the at least one drive element.

10. The micromirror device as recited in claim 9, wherein the at least one first spring is coupled to a carrier structure of the micromirror device at its end which is not coupled to the drive element.

11. The micromirror device as recited in claim 10, wherein a plurality of first springs is provided, which are coupled in a symmetrically distributed way to a post standing upright on the first plane, the post being coupled to the carrier structure of the micromirror device.

12. A projection device, comprising:
    at least one light source;
    at least one micromirror device, a drive unit situated in a first plane, the drive unit including a movable drive element and a guiding device, and a mirror elastically coupled to the drive element, the mirror being situated in an idle position in a second plane, which is in parallel to the first plane, wherein the guiding device is designed to guide a movement of the drive element on a straight line situated in the first plane, wherein the movement of the drive element is at least substantially entirely on the straight line; and
    a control unit designed to control the at least one micromirror device.

13. A projection device, comprising:
    at least one light source;
    at least one micromirror device, a drive unit situated in a first plane, the drive unit including a movable drive element and a guiding device, and a mirror elastically coupled to the drive element, the mirror being situated in an idle position in a second plane, which is in parallel to the first plane, wherein the guiding device is designed to guide a movement of the drive element on a straight line situated in the first plane; and
    a control unit designed to control the at least one micromirror device,
    wherein the guiding device includes at least one first spring, the at least one first spring including a leaf spring which has a lowest spring stiffness in a direction of the straight line and is coupled to the at least one drive element.

* * * * *